(12) United States Patent
Huang et al.

(10) Patent No.: US 11,445,276 B2
(45) Date of Patent: Sep. 13, 2022

(54) MULTIPLEXING CIRCUIT AND MOBILE TERMINAL

(71) Applicant: HONOR DEVICE CO., LTD., Shenzhen (CN)

(72) Inventors: Ting Huang, Shenzhen (CN); Zhi Chang, Shenzhen (CN); Yupeng Qiu, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/264,935

(22) PCT Filed: Sep. 24, 2019

(86) PCT No.: PCT/CN2019/107543
§ 371 (c)(1),
(2) Date: Feb. 1, 2021

(87) PCT Pub. No.: WO2020/063590
PCT Pub. Date: Apr. 2, 2020

(65) Prior Publication Data
US 2021/0321177 A1 Oct. 14, 2021

(30) Foreign Application Priority Data
Sep. 26, 2018 (CN) .......................... 201811126968.3

(51) Int. Cl.
*H04Q 11/00* (2006.01)
*G06F 3/16* (2006.01)
(Continued)

(52) U.S. Cl.
CPC ............. *H04Q 11/00* (2013.01); *G06F 3/162* (2013.01); *G10L 19/008* (2013.01); *H03H 11/34* (2013.01); *H04S 1/00* (2013.01); *H04Q 2213/034* (2013.01)

(58) Field of Classification Search
CPC ......... G06F 2213/0042; G06F 13/4282; G06F 13/385; G06F 13/4022; H04R 5/04; H04R 3/12; H04R 3/00
(Continued)

(56) References Cited

U.S. PATENT DOCUMENTS 10,063,223 B1    8/2018   Huang et al.
10,394,740 B1 *   8/2019   Guo .................... G06F 13/4022
(Continued)

FOREIGN PATENT DOCUMENTS

CN           202111352 U    1/2012
CN           104917880 A    9/2015
(Continued)

*Primary Examiner* — Alexander Krzystan
(74) *Attorney, Agent, or Firm* — Maier & Maier, PLLC

(57) ABSTRACT

A multiplexing circuit and a mobile terminal, related to the field of electronic and communications technologies, that resolve a problem that product costs are high when a mobile phone uses an integrated switch. In the multiplexing circuit, a first switch circuit transmits, to a first signal transmission end, a right sound channel audio signal provided by a right sound channel transmission end. A second switch circuit transmits, to a second signal transmission end, a left sound channel audio signal provided by a left sound channel transmission end. Signal transmission between the first signal transmission end and a first output end and signal transmission between the second signal transmission end and a second output end are implemented by using a third switch circuit. The first switch circuit includes a first transistor and a first constant voltage control circuit.

20 Claims, 8 Drawing Sheets

(51) Int. Cl.
*G10L 19/008* (2013.01)
*H03H 11/34* (2006.01)
*H04S 1/00* (2006.01)

(58) Field of Classification Search
USPC .................................. 381/81, 119, 80, 2, 311
See application file for complete search history.

(56) References Cited

U.S. PATENT DOCUMENTS

| | | |
|---|---|---|
| 10,949,374 B2 | 3/2021 | Yin |
| 2011/0293100 A1 | 12/2011 | Stultz et al. |
| 2014/0281071 A1 | 9/2014 | Xu et al. |
| 2014/0341205 A1 | 11/2014 | Powell et al. |
| 2016/0285446 A1 | 9/2016 | Snowdon et al. |
| 2016/0373408 A1* | 12/2016 | Wentworth ........... G06F 21/445 |
| 2017/0223445 A1* | 8/2017 | Bullen .................... H04R 3/04 |
| 2017/0318376 A1* | 11/2017 | Honeycutt ......... A63B 71/0622 |
| 2017/0344505 A1 | 11/2017 | Lin |
| 2017/0344508 A1* | 11/2017 | Setiawan ............ G06F 13/4022 |
| 2021/0321177 A1 | 10/2021 | Huang et al. |
| 2021/0400091 A1* | 12/2021 | Deng .................. H04L 65/1069 |

FOREIGN PATENT DOCUMENTS

| | | |
|---|---|---|
| CN | 105071795 A | 11/2015 |
| CN | 105867874 A | 8/2016 |
| CN | 106874233 A | 6/2017 |
| CN | 206226696 U | 6/2017 |
| CN | 107221983 A | 9/2017 |
| CN | 108335710 A | 7/2018 |
| CN | 109491942 A | 3/2019 |
| RU | 2603553 C2 | 11/2016 |
| WO | 2009061559 A1 | 5/2009 |

\* cited by examiner

MULTIPLEXING CIRCUIT AND MOBILE TERMINAL

CROSS-REFERENCE TO RELATED APPLICATIONS

This application is a national stage of International Application No. PCT/CN2019/107543, filed on Sep. 24, 2019, which claims priority to Chinese Patent Application No. 201811126968.3, filed on Sep. 26, 2018. Both of the aforementioned applications are hereby incorporated by reference in their entireties.

TECHNICAL FIELD

The embodiments relate to the field of electronic and communications technologies, and in particular, to a multiplexing circuit and a mobile terminal.

BACKGROUND

As requirements on portable performance of electronic products gradually increase, interfaces, on some mobile terminals such as mobile phones, configured to be coupled to external devices need to be highly compatible. To be compatible, a plurality of handover switches need to be disposed in a circuit that is in the mobile phone and that is coupled to the interface. In this way, when the interface is coupled to a data cable, a circuit that is in the mobile phone and that is configured to transmit data or a charging voltage can be electrically coupled to a pin of the interface through the plurality of handover switches, to provide external data or the charging voltage for the mobile phone. Alternatively, when the interface is coupled to a headset, a circuit that is in the mobile phone and that is related to audio playing may be electrically coupled to a pin of the interface through the plurality of handover switches, to transmit an audio signal of the mobile phone to the external headset. The handover switch is usually an integrated switch, and a structure of the integrated switch is complex. This increases product costs.

SUMMARY

The embodiments provide a multiplexing circuit and a mobile terminal, to resolve a problem that product costs are high when an integrated switch is configured to switch, in a mobile phone, a circuit coupled to an interface.

To achieve the foregoing objectives, the following technical solutions are used

According to one aspect of the embodiments, a multiplexing circuit is provided. The multiplexing circuit includes a first switch circuit, a second switch circuit, and a third switch circuit. In addition, the multiplexing circuit further includes a first signal transmission end, a second signal transmission end, a right sound channel transmission end, a left sound channel transmission end, a first output end, and a second output end. In this case, the first switch circuit is coupled to the first signal transmission end and the right sound channel transmission end, and the first switch circuit is configured to: receive a first voltage, and transmit, to the first signal transmission end under control of the first voltage, a right sound channel audio signal provided by the right sound channel transmission end. The second switch circuit is coupled to the second signal transmission end and the left sound channel transmission end, and the second switch circuit is configured to: receive the first voltage, and transmit, to the second signal transmission end under control of the first voltage, a left sound channel audio signal provided by the left sound channel transmission end. In addition, the third switch circuit is coupled to the first signal transmission end, the second signal transmission end, the first output end, and the second output end, and the third switch circuit is configured to: receive a second voltage, transmit, to the first output end under control of the second voltage, a signal provided by the first signal transmission end, and transmit, to the second output end, a signal provided by the second signal transmission end. Alternatively, the third switch circuit is configured to: receive the second voltage, transmit, to the first signal transmission end under control of the second voltage, a signal provided by the first output end, and transmit, to the second signal transmission end, a signal provided by the second output end. Therefore, when the third switch circuit is enabled, signal transmission between the first output end and the first signal transmission end and signal transmission between the second output end and the second signal transmission end can be implemented. In this way, when a mobile terminal having the multiplexing circuit is coupled to a headset through an external interface, the first switch circuit and the second switch circuit are enabled under control of the first voltage. In addition, the third switch circuit is disabled. In this case, the right sound channel audio signal and the left sound channel audio signal of a mobile phone may be output, through the right sound channel transmission end and the left sound channel audio signal respectively, to the headset coupled to the external interface. Alternatively, when the mobile phone is coupled to a data cable through the external interface, the third switch circuit is enabled under control of the second voltage. In addition, the first switch circuit and the second switch circuit are disabled. In this way, external data or a charging voltage may be transmitted to the first output end and the second output end of the multiplexing circuit through the data cable coupled to the external interface. Alternatively, when the third switch circuit is enabled, and the first switch circuit and the second switch circuit are disabled, the first output end and the second output end of the multiplexing circuit may transmit, through a data cable coupled to an external interface of the mobile terminal, data in the mobile terminal to an external device coupled to the data cable. The external device may be a mobile storage device, a mobile phone, a computer, or the like. Based on that, the first switch circuit includes a first transistor and a first constant voltage control circuit. A gate electrode of the first transistor is configured to receive the first voltage, a first electrode is coupled to the first signal transmission end, and a second electrode is coupled to the right sound channel transmission end. In this case, after receiving the first voltage, the gate electrode of the first transistor is in a conducting status, so that the right sound channel transmission end may transmit the right sound channel audio signal of the mobile phone to the first signal transmission end through the first transistor. In addition, the first constant voltage control circuit is coupled to the gate electrode and the second electrode of the first transistor, and the first constant voltage control circuit is configured to load the right sound channel audio signal to the gate electrode of the first transistor. In this way, the gate electrode of the first transistor also has the fluctuating right sound channel audio signal, and a voltage difference between the gate electrode and the second electrode of the first transistor is a constant direct current voltage. Therefore, in an audio signal transmission process, a probability that impedance of the first transistor changes is reduced, and a THD-N indice is improved. Similarly, the second switch circuit includes a second transistor and a second constant voltage control circuit. A gate electrode of the second transistor is configured to receive the first voltage, a first electrode is coupled to the second signal transmission end, and a second electrode is coupled to the left sound channel transmission end. In this case, after receiving the first voltage, the gate electrode of the second transistor is in the conducting status, so that the left sound channel transmission end may transmit the left sound channel audio signal of the mobile phone to the second signal transmission end through the second transistor. In addition, the second constant voltage control circuit is coupled to the gate electrode and the second electrode of the second transistor, and the second constant voltage control circuit is configured to load the left sound channel audio signal to the gate electrode of the second transistor, so that a voltage difference between the gate electrode and the second electrode of the second transistor is a constant direct current voltage.

Optionally, the first constant voltage control circuit includes a first capacitor. One end of the first capacitor is coupled to the gate electrode of the first transistor, and another end is coupled to the second electrode of the first transistor. The first capacitor supports an alternating current but blocks a direct current, so that the right sound channel audio signal at the right sound channel transmission end may be transmitted to the gate electrode of the first transistor through the first capacitor. In addition, a first direct current voltage cannot be transmitted to the right sound channel transmission end through the first capacitor.

Optionally, a capacitance value of the first capacitor ranges from 4 µF to 10 µF. When a resistance value of the capacitor is less than 4 µF, because the capacitance value is comparatively small, a blocking effect on the direct current voltage is comparatively poor, resulting in that an audio signal at the right sound channel transmission end or an audio signal at the left sound channel transmission end has comparatively large noise. When the resistance value of the capacitor is greater than 10 µF, the capacitor can well support an alternating current but block a direct current. However, a size of the capacitor is very large, so that comparatively large cabling space of the mobile phone is occupied.

Optionally, the first constant voltage control circuit further includes a first inductor. One end of the first inductor is coupled to the gate electrode of the first transistor, and another end is coupled to the second electrode of the first transistor. The first inductor is connected in parallel to the first capacitor. The first inductor has a filtering function. Therefore, noise on the gate electrode of the first transistor can be reduced when the audio signal at the right sound channel transmission end is loaded to the gate electrode of the first transistor through the first constant voltage control circuit.

Optionally, the first switch circuit further includes a first resistor. One end of the first resistor is coupled to the gate electrode of the first transistor, and another end is configured to receive the first voltage. In this case, the first resistor can prevent an alternating-current audio signal loaded to the gate electrode of the first transistor, in other words, the right sound channel audio signal is transmitted to a power supply configured to provide the first voltage. This affects another circuit structure coupled to the power supply.

Optionally, the second constant voltage control circuit includes a second capacitor. One end of the second capacitor is coupled to the gate electrode of the second transistor, and another end is coupled to the second electrode of the second transistor. Similarly, a technical effect of the second capacitor may be obtained based on a technical effect of the first capacitor, and details are not described herein again.

Optionally, a capacitance value of the second capacitor ranges from 4 µF to 10 µF. Similarly, a technical effect of a value range of the second capacitor may be obtained based on a technical effect of a value range of the capacitor of the first capacitor, and details are not described herein again.

Optionally, the second constant voltage control circuit further includes a second inductor. One end of the second inductor is coupled to the gate electrode of the second transistor, and another end is coupled to the second electrode of the second transistor. Similarly, a technical effect of the second inductor may be obtained based on a technical effect of the first inductor, and details are not described herein again.

Optionally, the second switch circuit further includes a second resistor. One end of the second resistor is coupled to the gate electrode of the second transistor, and another end is configured to receive the first voltage. Similarly, a technical effect of the second resistor may be obtained based on a technical effect of the first resistor, and details are not described herein again.

Optionally, the third switch circuit includes a third transistor and a fourth transistor. A gate electrode of the third transistor is configured to receive the second voltage, a first electrode is coupled to the first output end, and a second electrode is coupled to the first signal transmission end. A gate electrode of the fourth transistor is configured to receive the second voltage, a first electrode is coupled to the second output end, and a second electrode is coupled to the second signal transmission end. In this case, when the mobile terminal having the multiplexing circuit is coupled to the data cable through the external interface, the first transistor and the second transistor are cut off under control of the first voltage. In addition, the third transistor and the fourth transistor are conducted under control of the second voltage. In this way, the data cable coupled to the external interface transmits the external data or the charging voltage to the first signal transmission end, and then transmits the external data or the charging voltage to the first output end through the third transistor. In addition, the data cable coupled to the external interface further transmits the external data or the charging voltage to the second signal transmission end, and then transmits the external data or the charging voltage to the second output end through the fourth transistor.

Optionally, the third switch circuit is further coupled to the right sound channel transmission end and the left sound channel transmission end. The third switch circuit further includes a third capacitor and a fourth capacitor. One end of the third capacitor is coupled to the gate electrode of the third transistor, and another end of the third capacitor is coupled to the right sound channel transmission end. One end of the fourth capacitor is coupled to the gate electrode of the fourth transistor, and another end of the fourth capacitor is coupled to the left sound channel transmission end. In this case, the right sound channel audio signal at the right sound channel transmission end is transmitted to the gate electrode of the third transistor through the third capacitor. In this case, when the right sound channel audio signal transmitted to the first signal transmission end is applied to the second electrode of the third transistor, a voltage difference between the gate electrode and the second electrode of the third transistor is zero, and the third transistor is still in a cut-off status. This avoids that the first signal transmission end and the first output end form a signal path used to transmit the external data or the charging voltage when the headset is inserted into the mobile phone.

Similarly, a technical effect of the fourth capacitor may be obtained based on a technical effect of the third capacitor, and details are not described herein again.

Optionally, the third switch circuit further includes a third resistor, a fourth resistor, a fifth resistor, and a sixth resistor. One end of the third resistor is configured to receive the second voltage, and another end is coupled to the gate electrode of the third transistor. One end of the fourth resistor is coupled to the gate electrode of the third transistor, and another end is grounded. One end of the fifth resistor is configured to receive the second voltage, and another end is coupled to the gate electrode of the fourth transistor. One end of the sixth resistor is coupled to the gate electrode of the fourth transistor, and another end is grounded. A resistance value of the third resistor and a resistance value of the fourth resistor are set, so that the third resistor and the fourth resistor can divide the second voltage, to reduce a voltage on the gate electrode of the third transistor. In addition, a resistance value of the fifth resistor and a resistance value of the sixth resistor are set, so that the fifth resistor and the sixth resistor can divide the second voltage, to reduce a voltage on the gate electrode of the fourth transistor.

According to one aspect of the embodiments, a mobile terminal is provided, including a central processing unit, an audio codec, an external interface configured to be coupled to an external device, and any multiplexing circuit described above. The external interface includes a D+ pin and a D− pin that are specified according to a Type-C interface protocol. A first signal transmission end of the multiplexing circuit is coupled to the D+ pin, a second signal transmission end is coupled to the D− pin, and a right sound channel transmission end and a left sound channel transmission end are coupled to the audio codec. An audio decoder is further connected to the central processing unit. The audio codec is configured to: decode an audio signal output by the central processing unit, provide a right sound channel audio signal to the right sound channel transmission end, and provide a left sound channel audio signal to the left sound channel transmission end. In addition, a first output end and a second output end of the multiplexing circuit are coupled to the central processing unit, and the multiplexing circuit is configured to provide a signal of the D+ pin and a signal of the D− pin to the central processing unit through the first output end and the second output end respectively. The mobile terminal has a technical effect that is the same as that of the multiplexing circuit provided in the foregoing embodiments. Details are not described herein again.

According to still another aspect of the embodiments, a control method of any multiplexing circuit described above is provided. When the multiplexing circuit is configured to transmit an audio signal, the method includes: controlling, by a first voltage, to enable a first switch circuit, where the first switch circuit transmits, to a first signal transmission end, a right sound channel audio signal provided by a right sound channel transmission end, and loads the right sound channel audio signal to a gate electrode of a first transistor of the first switch circuit; controlling, by the first voltage, to enable a second switch circuit, where the second switch circuit transmits, to a second signal transmission end, a left sound channel audio signal provided by a left sound channel transmission end, and loads the left sound channel audio signal to a gate electrode of a second transistor of the second switch circuit; and disabling a third switch circuit.

According to still another aspect of the embodiments, a control method of any multiplexing circuit described above is provided. When the multiplexing circuit is configured to transmit a charging voltage or external data, the method includes: disabling a first switch circuit and a second switch circuit; and controlling, by a second voltage, to enable a third switch circuit, where the third switch circuit transmits, to a first output end, a signal provided by a first signal transmission end, and transmits, to a second output end, a signal provided by a second signal transmission end; or the third switch circuit transmits, to the first signal transmission end, a signal provided by the first output end, and transmits, to the second signal transmission end, a signal provided by the second output end. The control method of the multiplexing circuit has a technical effect that is same as that of the multiplexing circuit provided in the foregoing embodiments. Details are not described herein again.

DESCRIPTION OF EMBODIMENTS

The following terms "first" and "second", and the like are merely intended for a purpose of description, and shall not be understood as an indication or implication of relative importance or implicit indication of the number of indicated technical features. Therefore, a feature limited by "first" or "second", or the like may explicitly or implicitly include one or more features.

Figure 1:
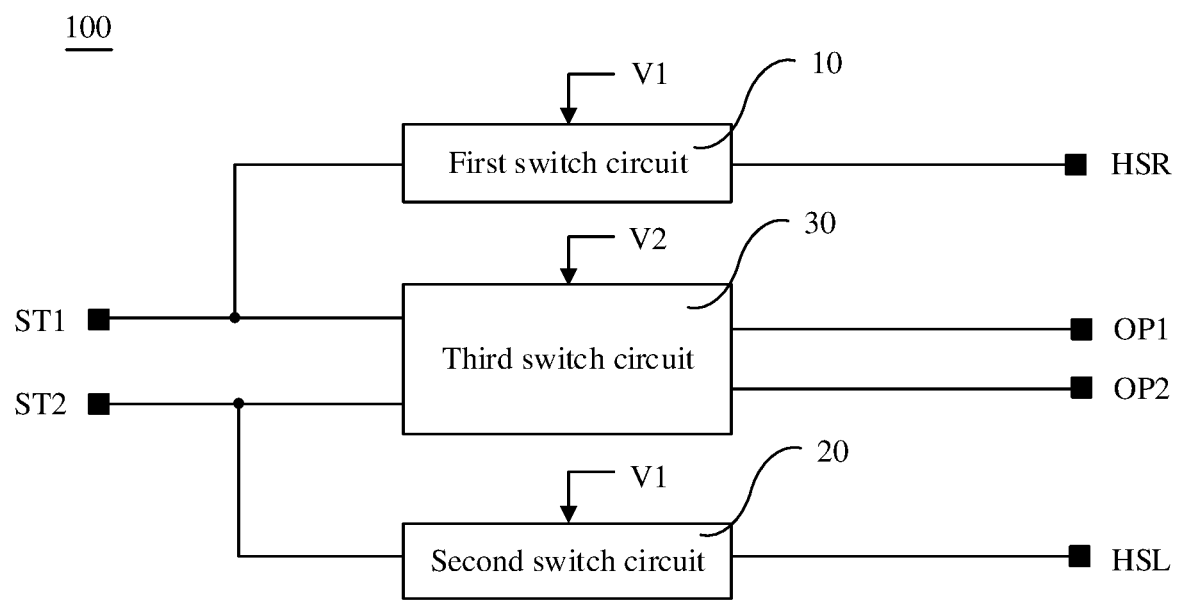
FIG. 1 is a schematic structural diagram of a multiplexing circuit according to some embodiments.

Some embodiments provide a multiplexing circuit 100. As shown in FIG. 1, the multiplexing circuit 100 includes a first switch circuit 10, a second switch circuit 20, and a third switch circuit 30.

In addition, the multiplexing circuit 100 further includes a first signal transmission end ST1, a second signal transmission end ST2, a right sound channel transmission end HSR, a left sound channel transmission end HSL, a first output end OP1, and a second output end OP2.

The first switch circuit 10 is coupled to the first signal transmission end ST1 and the right sound channel transmission end HSR. The first switch circuit 10 is configured to:

receive a first voltage V1, and transmit, to the first signal transmission end ST1 under control of the first voltage V1, a right sound channel audio signal provided by the right sound channel transmission end HSR.

The second switch circuit 20 is coupled to the second signal transmission end ST2 and the left sound channel transmission end HSL. The second switch circuit 20 is configured to: receive the first voltage V1, and transmit, to the second signal transmission end ST2 under control of the first voltage V1, a left sound channel audio signal provided by the left sound channel transmission end HSL.

The third switch circuit 30 is coupled to the first signal transmission end ST1, the second signal transmission end ST2, the first output end OP1, and the second output end OP2. The third switch circuit 30 is configured to: receive a second voltage V2, transmit, to the first output end OP1 under control of the second voltage V2, a signal provided by the first signal transmission end ST1, and transmit, to the second output end OP2, a signal provided by the second signal transmission end ST2. Alternatively, the third switch circuit 30 is configured to: receive the second voltage V2, transmit, to the first signal transmission end ST1 under control of the second voltage V2, a signal provided by the first output end OP1, and transmit, to the second signal transmission end ST1, a signal provided by the second output end OP2. Therefore, when the third switch circuit 30 is enabled, signal transmission between the first signal transmission end ST1 and the first output end OP1 and signal transmission between the second signal transmission end ST2 and the second output end OP2 can be implemented.

Figure 8:
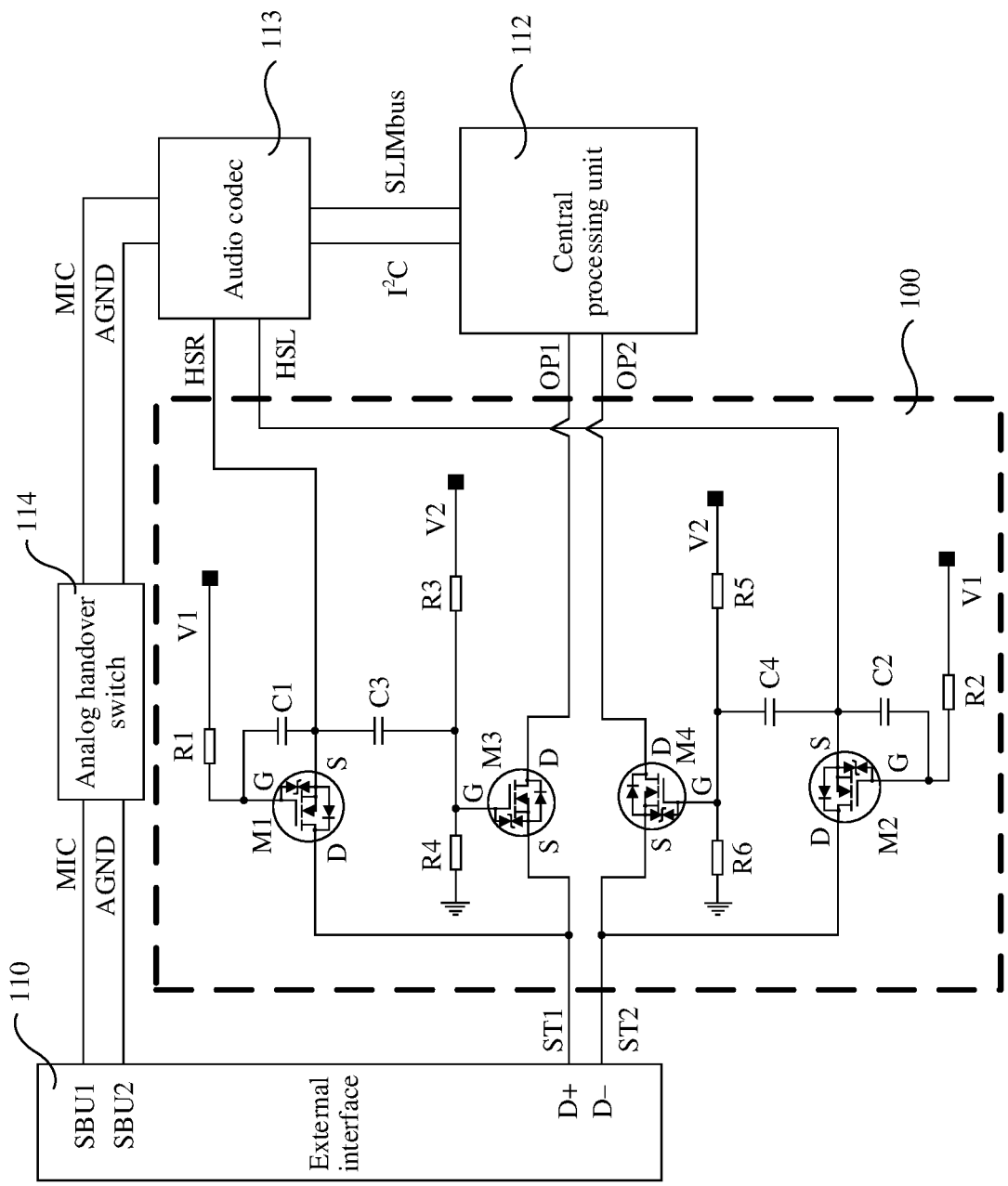
FIG. 8 is a schematic structural diagram of a mobile terminal according to some embodiments.

In addition, a mobile terminal having the multiplexing circuit 100 includes an external interface 110 (as shown in FIG. 8) configured to be coupled to an external device. The external interface 110 includes a CC pin specified according to a Type-C interface protocol. The CC pin may identify a type of the external device coupled to a Type-C interface.

In this case, when the mobile terminal having the multiplexing circuit 100, for example, a mobile phone, is coupled to a headset through the Type-C interface, the CC pin may identify that the external device coupled to the Type-C interface is the headset. In this case, a power supply (for example, a battery of the mobile phone) may provide the first voltage V1 for the first switch circuit 10 and the second switch circuit 20 based on an identification result of the CC pin, and provide the second voltage V2 for the third switch circuit 30. The first switch circuit 10 and the second switch circuit 20 are enabled under control of the first voltage V1. In addition, the third switch circuit 30 is disabled under control of the second voltage V2. In this way, the right sound channel audio signal and the left sound channel audio signal of the mobile phone may be output, through the right sound channel transmission end HSR and the left sound channel audio signal HSL respectively, to the headset coupled to the external interface.

Alternatively, when the mobile terminal, for example, the mobile phone, is coupled to a data cable through the external interface, the CC pin identifies that the external device coupled to the Type-C interface is not the headset, but another external device coupled to the data cable, for example, a charger, a mobile storage device, a mobile phone, a computer, or the like. In this case, a power supply (for example, a battery of a mobile phone or an external device) may provide the second voltage V2 for the third switch circuit 30 based on an identification result of the CC pin, and provide the first voltage V1 for the first switch circuit 10 and the second switch circuit 20. The third switch circuit 30 is enabled under control of the second voltage V2. In addition, the first switch circuit 10 and the second switch circuit 20 are disabled under control of the first voltage V1. In this way, external data or a charging voltage may be transmitted to the first output end OP1 and the second output end OP2 of the multiplexing circuit 100 through the data cable coupled to the external interface. Alternatively, the first output end OP1 and the second output end OP2 of the multiplexing circuit 100 may transmit, through the data cable coupled to the Type-C interface of the mobile terminal, data in the mobile terminal to the external device coupled to the data cable.

It can be noted that, it can be understood from the foregoing description that the first voltage V1 provided by the power supply (for example, the battery of the mobile phone) can not only control the first switch circuit 10 and the second switch circuit 20 to be enabled, but also control the first switch circuit 10 and the second switch circuit 20 to be disabled. For ease of description, the first voltage V1 used to control the first switch circuit 10 and the second switch circuit 20 to be enabled is referred to as an effective first voltage V1. The first voltage V1 used to control the first switch circuit 10 and the second switch circuit 20 to be disabled is referred to as an invalid first voltage V1. Similarly, the second voltage V2 used to control the third switch circuit 30 to be enabled is referred to as an effective second voltage V2. The second voltage V2 used to control the third switch circuit 30 to be disabled is referred to as an invalid second voltage V2.

Figure 2:
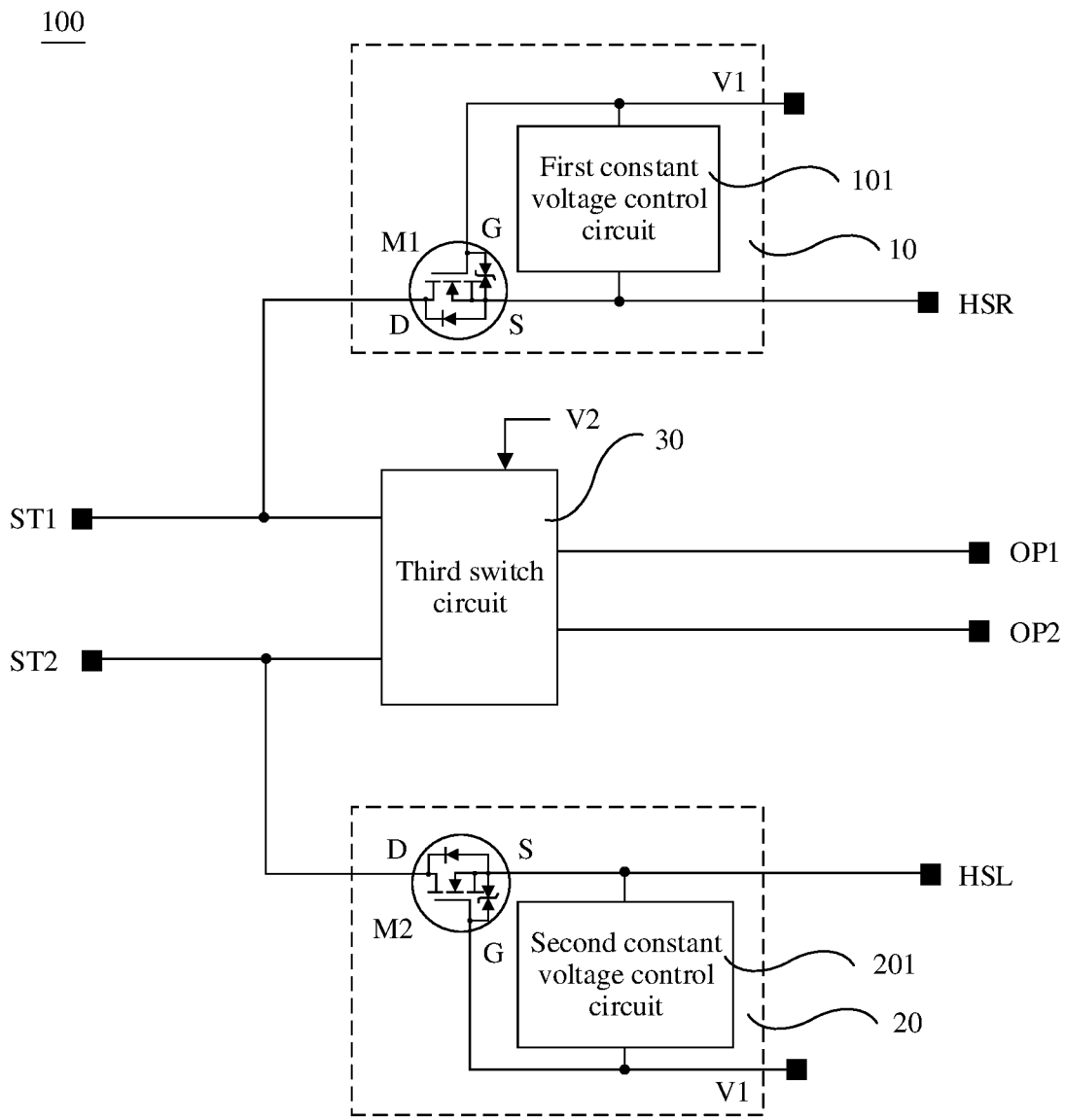
FIG. 2 is a schematic structural diagram of another multiplexing circuit according to some embodiments.

In addition, as shown in FIG. 2, the first switch circuit 10 includes a first transistor M1.

A gate (G) electrode of the first transistor M1 is configured to receive the first voltage V1, a first electrode (for example, a drain electrode) is coupled to the first signal transmission end ST1, and a second electrode (for example, a source electrode) is coupled to the right sound channel transmission end HSR.

In this case, after receiving the first voltage V1, the gate electrode of the first transistor M1 is in a conducting status, so that the right sound channel transmission end HSR may transmit the right sound channel audio signal of the mobile phone to the first signal transmission end ST1 through the first transistor M1.

Based on this, because an audio signal is an alternating-current signal, the audio signal fluctuates, in other words, a voltage loaded on the second electrode of the first transistor M1 fluctuates. The first voltage V1 used to control the first transistor M1 to be conducted is a direct current voltage, for example, 3 V. In this way, a voltage difference Vgs between the gate electrode and the second electrode of the first transistor M1 changes with fluctuation of the right sound channel audio signal, so that impedance of the first transistor M1 changes. Consequently, a total harmonic distortion-noise (THD-N) indice of audio is affected.

To resolve the foregoing problem, as shown in FIG. 2, the first switch circuit 10 further includes a first constant voltage control circuit 101.

Figure 3:
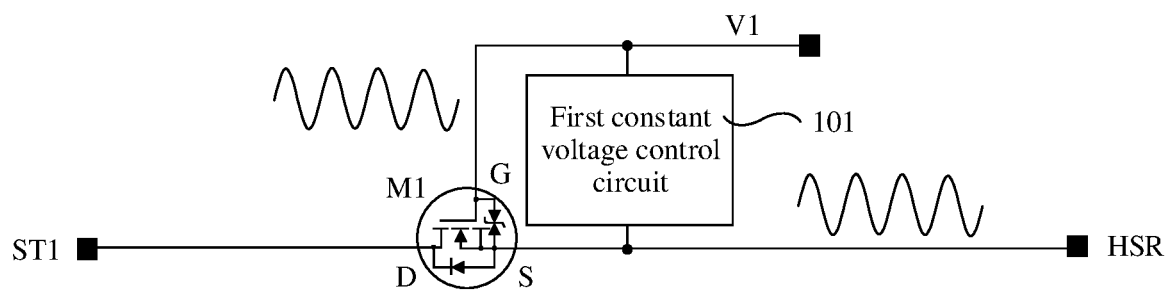
FIG. 3 is a schematic diagram of loading a right sound channel audio signal to a gate electrode of a first transistor in FIG. 2.

The first constant voltage control circuit 101 is coupled to the gate electrode and the second electrode of the first transistor M1. As shown in FIG. 3, the constant voltage control circuit 101 is configured to load the right sound channel audio signal (represented by a sine wave in the figure) to the gate electrode of the first transistor M1. In this way, the gate electrode of the first transistor M1 also has the fluctuating right sound channel audio signal, and the voltage difference Vgs between the gate electrode and the second electrode of the first transistor M1 is equal to V1 and is equal to 3V, which is a constant direct current voltage. Therefore, in an audio signal transmission process, a probability that the impedance of the first transistor M1 changes is reduced, and the THD-N indice is improved.

In addition, as shown in FIG. 2, the second switch circuit 20 includes a second transistor M2.

A gate electrode of the second transistor M2 is configured to receive the first voltage V1, a first electrode is coupled to the second signal transmission end ST2, and a second electrode is coupled to the left sound channel transmission end HSL. In this case, after receiving the first voltage V1, the gate electrode of the second transistor M2 is in the conducting status, so that the left sound channel transmission end HSL may transmit the left sound channel audio signal of the mobile phone to the second signal transmission end ST2 through the second transistor M2.

Similarly, the second switch circuit 20 further includes a second constant voltage control circuit 201 to reduce a probability that impedance of the second transistor M2 changes.

The second constant voltage control circuit 201 is coupled to the gate electrode and the second electrode of the second transistor M2, and the constant voltage control circuit 201 is configured to load the left sound channel audio signal to the gate electrode of the second transistor M2, so that a voltage difference Vgs between the gate electrode and the second electrode of the second transistor M2 is equal to V1 and is equal to 3V, which is the constant direct current voltage.

It can be noted that, in the embodiments, the first transistor M1 and the second transistor M2 may be metal-oxide-semiconductor field-effect transistors, thin film transistors (TFT), or triodes, this is not limited.

In the embodiments, a first electrode of a transistor may be a source (S) electrode, and a second electrode may be a drain (D) electrode. Alternatively, the first electrode is the drain electrode, and the second electrode is the source electrode. For ease of description, the following embodiments of all use an example in which the transistor is an NMOS transistor, the first electrode is the drain electrode, and the second electrode is the source electrode for description.

In addition, a direct current power supply, for example, the battery of the mobile phone, may be disposed in the mobile phone, and is configured to provide the first voltage V1 for the gate electrode of the first transistor M1 and the gate electrode of the second transistor M2.

For example, the first transistor M1 and the second transistor M2 are n-type transistors. When the CC pin in the Type-C interface of the mobile phone identifies that the external device coupled to the Type-C interface is the headset, the first transistor M1 and the second transistor M2 need to be conducted, to enable the first switch circuit 10 and the second switch circuit 20 respectively. In this case, the first voltage V1 that is provided by the direct current power supply based on the identification result of the CC pin is at a constant high level (namely, the effective first voltage V1). When the CC pin in the Type-C interface of the mobile phone identifies that the external device coupled to the Type-C interface is not the headset, but another external device coupled to the data cable, for example the charger, the mobile storage device, the mobile phone, the computer, or the like, the first transistor M1 and the second transistor M2 need to be cut off, to enable the first switch circuit 10 and the second switch circuit 20 respectively. In this case, the first voltage V1 that is provided by the direct current power supply based on the identification result of the CC pin is at a constant low level (namely, the invalid first voltage V1).

The following describes a structure of the first constant voltage control circuit 101 and a structure of the second constant voltage control circuit 201 in detail with examples.

Figure 4:
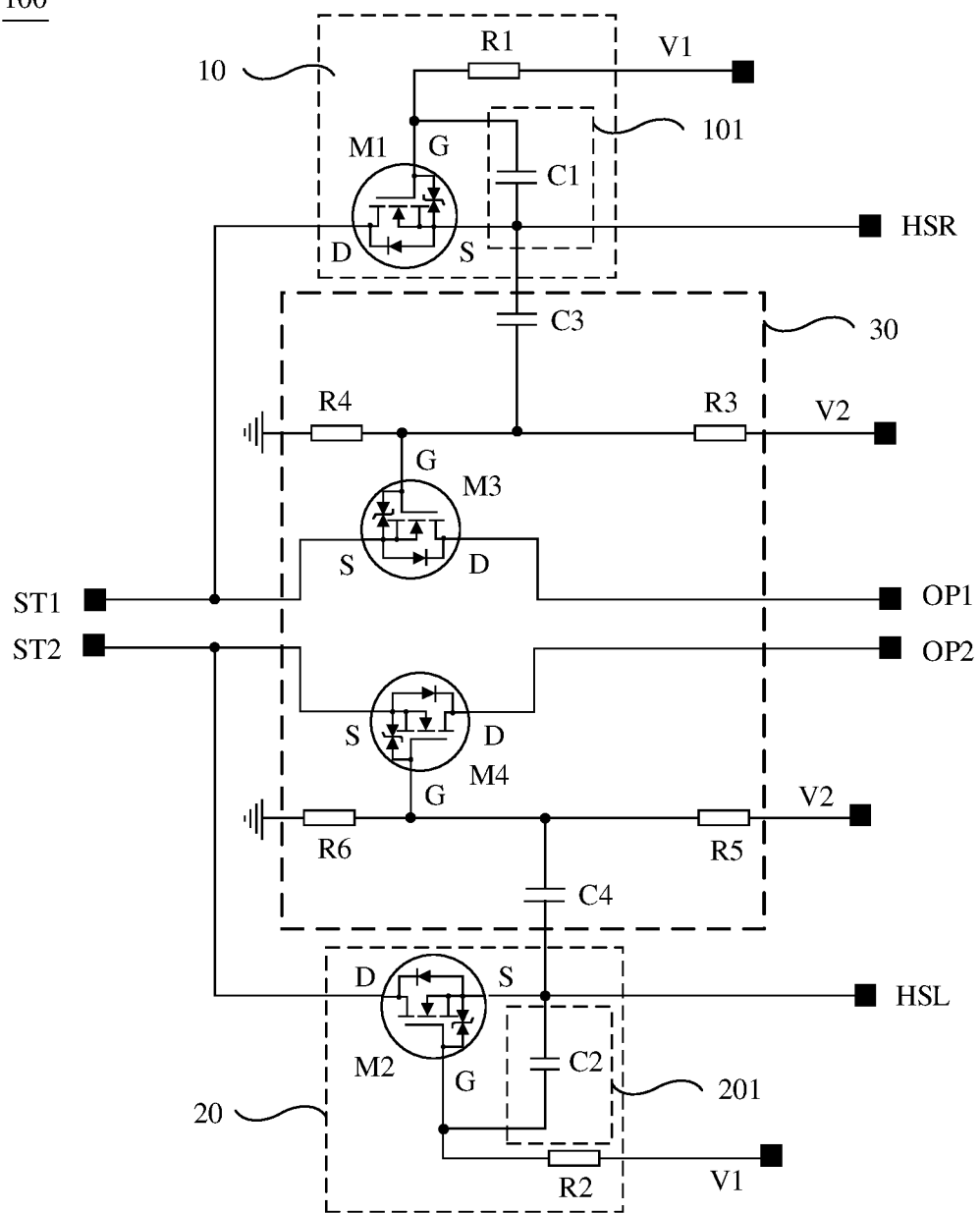
FIG. 4 is a schematic structural diagram of another multiplexing circuit according to some embodiments.

In some embodiments, as shown in FIG. 4, the first constant voltage control circuit 101 includes a first capacitor C1. One end of the first capacitor C1 is coupled to the gate electrode of the first transistor M1, and another end is coupled to the second electrode of the first transistor M2.

In this case, because the first capacitor C1 supports an alternating current but blocks a direct current, an alternating current signal, namely, the right sound channel audio signal, at the right sound channel transmission end HSR can be transmitted to the gate electrode of the first transistor M1 through the first capacitor C1. Therefore, a voltage difference Vgs between the gate electrode and the second electrode of the first transistor M1 is equal to V1. In addition, a first direct current voltage V1 cannot be transmitted to the right sound channel transmission end HSR through the first capacitor C1.

Similarly, as shown in FIG. 4, the second constant voltage control circuit 201 includes a second capacitor C2. One end of the second capacitor C2 is coupled to the gate electrode of the second transistor M2, and another end is coupled to the second electrode of the second transistor M2.

In this case, because the second capacitor C2 supports an alternating current but blocks a direct current, the left sound channel audio signal at the left sound channel transmission end HSL can be transmitted to the gate electrode of the second transistor M2 through the second capacitor C2. Therefore, a voltage difference Vgs between the gate electrode and the second electrode of the second transistor M2 is equal to V1. In addition, a first direct current voltage V2 cannot be transmitted to the left sound channel transmission end HSL through the second capacitor C2.

In some embodiments, capacitance values of the first capacitor C1 and the second capacitor C2 may be from 4 µF to 10 µF. When a resistance value of the capacitor is less than 4 µF, because the capacitance value is comparatively small, a blocking effect on the direct current voltage is comparatively poor, resulting in that an audio signal at the right sound channel transmission end HSR or an audio signal at the left sound channel transmission end HSL has comparatively large noise. When the resistance value of the capacitor is greater than 10 µF, the capacitor can well support an alternating current but block a direct current. However, a size of the capacitor is comparatively large, so that comparatively large cabling space of the mobile phone is occupied.

In some embodiments, the capacitance values of the first capacitor C1 and the second capacitor C2 may be 4.5 µF, 4.7 µF, 5 µF, 7 µF, or the like.

Figure 5:
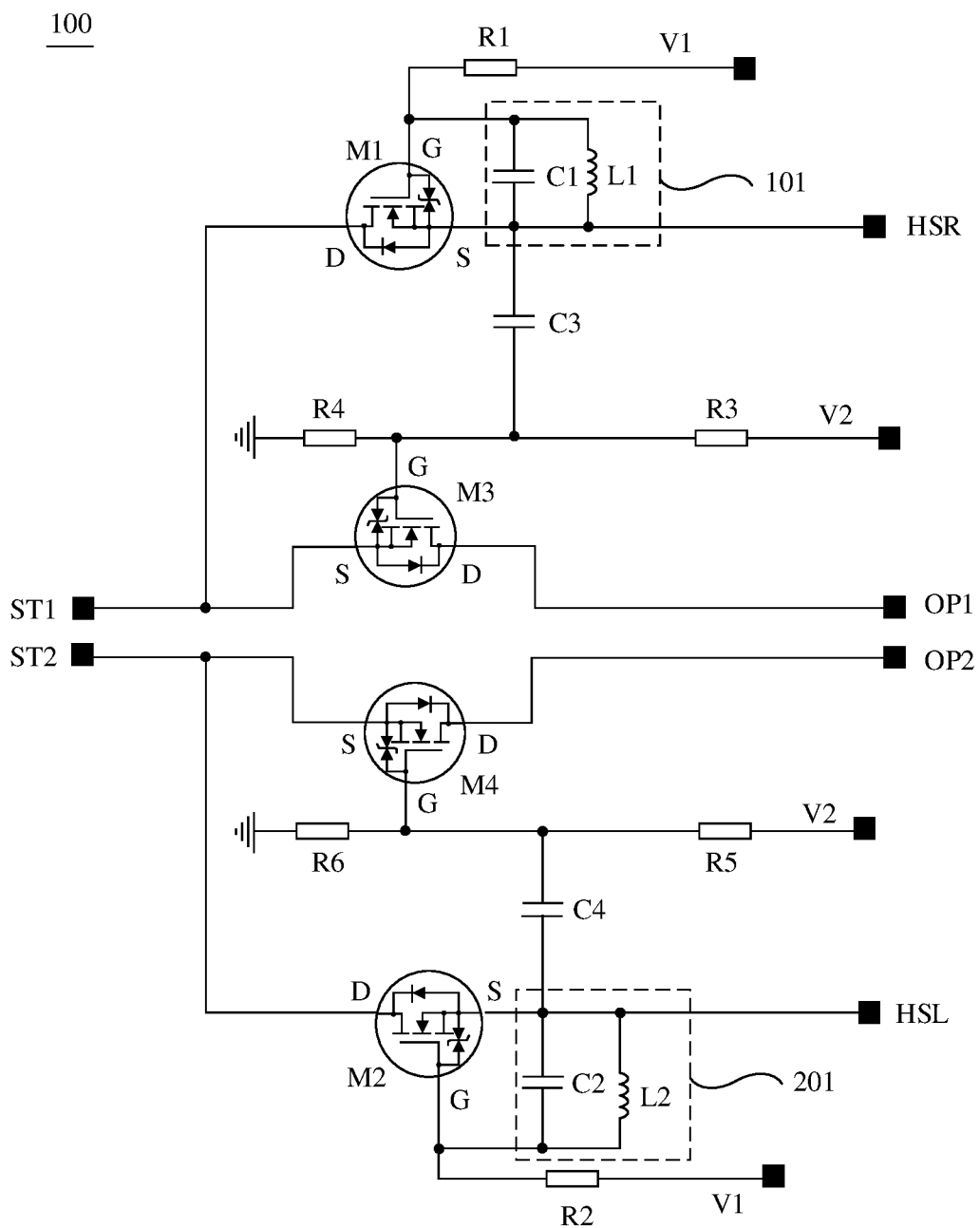
FIG. 5 is a schematic structural diagram of another multiplexing circuit according to some embodiments.

In addition, in some embodiments, the structure of the first constant voltage control circuit 101 and the structure of the second constant voltage control circuit 201 further include an inductor. As shown in FIG. 5, the first constant voltage control circuit 101 further includes a first inductor L1. One end of the first inductor L1 is coupled to the gate electrode of the first transistor M1, and another end of the first inductor L1 is coupled to the second electrode of the first transistor M1. In this case, the first inductor L1 is connected in parallel to the first capacitor C1. The first inductor L1 has a filtering function. Therefore, noise on the gate electrode of the first transistor M1 can be reduced when the audio signal at the right sound channel transmission end HSR is loaded to the gate electrode of the first transistor M1 through the first constant voltage control circuit 101.

In this case, in comparison with the structure of the first constant voltage control circuit 101 shown in FIG. 4, a structure of the first constant voltage control circuit 101 shown in FIG. 5 has less noise. Therefore, a frequency of the right sound channel audio signal transmitted at the right sound channel transmission end HSR may be higher, for example, from 10 Hz to 20 Hz.

Similarly, as shown in FIG. 5, the second constant voltage control circuit 201 further includes a second inductor L2. One end of the second inductor L2 is coupled to the gate electrode of the second transistor M2, and another end is coupled to the second electrode of the second transistor M2. In this case, the second inductor L2 is connected in parallel to the second capacitor C2. The second inductor L2 has the filtering function. Therefore, noise on the gate electrode of the second transistor M2 can be reduced when the audio signal at the left sound channel transmission end HSL is loaded to the gate electrode of the second transistor M2 through the second constant voltage control circuit 201.

In this case, in comparison with the structure of the second constant voltage control circuit 201 shown in FIG. 4, a structure of the second constant voltage control circuit 201 shown in FIG. 5 has less noise. Therefore, a frequency of the left sound channel audio signal transmitted at the left sound channel transmission end HSL may be higher, for example, from 10 Hz to 20 Hz.

Thus, when the first transistor M1 is conducted, the right sound channel audio signal provided by the right sound channel transmission end HSR may be transmitted to the first signal transmission end ST1 through one transistor in the first switch circuit 10, for example, the first transistor M1. In addition, the first capacitor C1 is coupled between the gate electrode and the second electrode of the first transistor M1, or the first capacitor C1 and the first inductor L1 that are connected in parallel are coupled between the gate electrode and the second electrode of the first transistor M1, to avoid a change in the impedance of the first transistor M1 when the first transistor M1 is affected by the fluctuation of the right sound channel audio signal. Therefore, the first capacitor C1 loads the alternating current right sound channel audio signal to the gate electrode of the first transistor M1, so that the voltage difference Vgs between the gate electrode and the second electrode of the first transistor M1 is a fixed value, and a probability that the impedance of the first transistor M1 changes with the fluctuation of the right sound channel audio signal is reduced.

Based on this, for a solution in which an integrated switch is used, at least one pair of an NMOS transistor and a PMOS transistor that are coupled to each other are usually disposed in the integrated switch, to avoid a change in impedance of the integrated switch in a process of transmitting an audio signal. The NMOS transistor increases with the fluctuation of the audio signal, and the impedance increases. The PMOS transistor decreases with the fluctuation of the audio signal, and the impedance decreases. In this way, an impedance change of the NMOS transistor and an impedance change of the PMOS transistor are superimposed, to reduce a probability that the impedance of the integrated switch changes. In comparison with the integrated switch, in the first switch circuit 10 provided in the foregoing embodiments, a quantity of transistors is smaller, a simpler structure facilitates in reducing product costs, and an impedance change of the first switch circuit 10 can be effectively reduced.

In addition, a technical effect of the second switch circuit 20 is the same as that described above, and details are not described herein again.

In some embodiments, as shown in FIG. 4, the first switch circuit further includes a first resistor R1. One end of the first resistor R1 is coupled to the gate electrode of the first transistor M1, and another end is coupled to the power supply configured to provide the first voltage V1, to receive the first voltage V1. In this case, the first resistor R1 can prevent an alternating-current audio signal loaded to the gate electrode of the first transistor M1, in other words, the right sound channel audio signal is transmitted to the power supply configured to provide the first voltage V1. This affects another circuit structure coupled to the power supply.

Similarly, as shown in FIG. 4, the second switch circuit 20 further includes a second resistor R2. One end of the second resistor R2 is coupled to the gate electrode of the second transistor M2, and another end is coupled to the power supply configured to provide the first voltage V1, to receive the first voltage V1. In this case, the second resistor R2 can prevent an alternating-current audio signal loaded to the gate electrode of the second transistor M2, in other words, the right sound channel audio signal is transmitted to the power supply configured to provide the first voltage V1. This affects another circuit structure coupled to the power supply.

The following describes a structure of the third switch circuit 30.

In some embodiments, as shown in FIG. 4, the third switch circuit 30 includes a third transistor M3 and a fourth transistor M4.

A gate electrode of the third transistor M3 is configured to receive the second voltage V2, a first electrode is coupled to the first output end OP1, and a second electrode is coupled to the first signal transmission end ST1.

A gate electrode of the fourth transistor M4 is configured to receive the second voltage V2, a first electrode is coupled to the second output end OP2, and a second electrode is coupled to the second signal transmission end ST2.

In this case, when the mobile terminal having the multiplexing circuit 100, for example, the mobile phone, is coupled to the data cable through the external interface (for example, the Type_C interface), the first transistor M1 and the second transistor M2 are cut off under control of the first voltage V1. In addition, the third transistor M3 and the fourth transistor M4 are conducted under control of the second voltage V2. In this way, the data cable coupled to the external interface transmits the external data or the charging voltage to the first signal transmission end ST1, and then transmits the external data or the charging voltage to the first output end OP1 through the third transistor M3. In addition, the data cable coupled to the external interface further transmits the external data or the charging voltage to the second signal transmission end ST2, and then transmits the external data or the charging voltage to the second output end OP2 through the fourth transistor M4. Alternatively, the first output end OP1 of the multiplexing circuit 100 may transmit the data in the mobile terminal to the first signal transmission end ST1 through the third transistor M3, and the second output end OP2 of the multiplexing circuit 100 may transmit the data in the mobile terminal to the second signal transmission end ST2 through the fourth transistor M4. In this way, the data cable coupled to the external interface receives the data in the mobile terminal, and transmits the data to the external device coupled to the data cable.

For example, the third transistor M3 and the fourth transistor M4 are n-type transistors. When the CC pin in the Type-C interface of the mobile phone identifies that the external device coupled to the Type-C interface is the headset, the third transistor M3 and the fourth transistor M4 need to be cut off, to disable the third switch circuit 30. In this case, the second voltage V2 that is provided by the direct current power supply (for example, the battery of the mobile phone or the external device) based on the identification result of the CC pin is at a constant low level (namely, the invalid second voltage V2).

When the CC pin in the Type-C interface of the mobile phone identifies that the external device coupled to the Type-C interface is not the headset, but another external device coupled to the data cable, for example, the charger, the mobile storage device, the mobile phone, the computer, or the like, the third transistor M3 and the fourth transistor M4 need to be conducted, to enable the third switch circuit 30. In this case, the second voltage V2 that is provided by the direct current power supply based on the identification result of the CC pin is at a constant high level (namely, the effective voltage V2).

Based on this, when the second voltage V2 is at the high level, the second voltage V2 may be provided by the external device coupled to the Type-C interface. For example, when the Type-C interface is coupled to the charger, the second voltage V2 is provided by the charger, and the charger is the direct current power supply. For another example, when the Type-C interface is coupled to the mobile storage device (for example, a USB flash drive or a removable hard disk), the battery of the mobile phone supplies power to the storage device. In this case, the storage device can provide the second voltage V2 for the gate electrode of the third transistor M3 and the gate electrode of the fourth transistor M4, and the storage device is the direct current power supply. Alternatively, the battery of the mobile phone may perform system power supply on the second voltage V2. In this case, the battery of the mobile phone is the direct current power supply.

Based on this, in the multiplexing circuit 100 provided, one of circuit structures related to the foregoing two power supply manners of the second voltage V2 may be selected and disposed. Alternatively, both circuit structures related to the foregoing two power supply manners are disposed in the multiplexing circuit 100. However, in a use process, a power supply path in which the second voltage V2 is at the high level may be formed by a gating switch selecting a circuit structure of only one power supply manner.

In addition, when the second voltage V2 is at the high level, and regardless of whether a charger power supply manner or a system power supply manner is used to provide the second voltage V2 for the third transistor M3 and the fourth transistor M4, as shown in FIG. 4, the third switch circuit 30 further includes a third resistor R3 and a fourth resistor R4, to avoid a case in which the second voltage V2 has a comparatively large voltage value, and the third transistor M3 and the fourth transistor M4 are adversely affected.

One end of the third resistor R3 is configured to receive the second voltage V2, and another end is coupled to the gate electrode of the third transistor M3. One end of the fourth resistor R4 is coupled to the gate electrode of the third transistor M3, and another end is grounded. In this way, a resistance value of the third resistor R3 and a resistance value of the fourth resistor R4 are set, so that the third resistor R3 and the fourth resistor R4 can divide the second voltage V2, to reduce a voltage on the gate electrode of the third transistor M3.

Similarly, the third switch circuit 30 further includes a fifth resistor R5 and a sixth resistor R6.

One end of the fifth resistor R5 is configured to receive the second voltage V2, and another end is coupled to the gate electrode of the fourth transistor M4. One end of the sixth resistor R6 is coupled to the gate electrode of the fourth transistor M4, and another end is grounded. In this way, a resistance value of the fifth resistor R5 and a resistance value of the sixth resistor R6 are set, so that the fifth resistor R5 and the sixth resistor R6 can divide the second voltage V2, to reduce a voltage on the gate electrode of the fourth transistor M4.

In this case, when the third transistor M3 and the fourth transistor M4 need to be cut off, a circuit powered by the charger or a system may be disconnected from the gate electrode of the third transistor M3 and the gate electrode of the fourth transistor M4. In this case, the fourth resistor R4 and the sixth resistor R6 in which one end of the fourth resistor R4 and one end of the sixth resistor R6 are grounded decrease a gate electrode voltage of the third transistor M3 and a gate electrode voltage of the fourth transistor M4. In this case, the second voltage V2 is at the low level, and the third transistor M3 and the fourth transistor M4 are cut off.

Based on this, a structure shown in FIG. 4 is used as an example. It can be understood from the foregoing description that, when the mobile phone having the multiplexing circuit 100 is coupled to the headset through the Type-C interface, the third transistor M3 and the fourth transistor M4 may be cut off, and the first transistor M1 and the second transistor M2 are conducted. In this case, a negative voltage of the right sound channel audio signal and a negative voltage of the left sound channel audio signal are transmitted to the first signal transmission end ST1 through the right sound channel transmission end HSR and the second signal transmission end ST2 through the left sound channel transmission end HSL respectively, and are applied to the second electrode (S) of the third transistor M3 and the second electrode of the fourth transistor M4, respectively. This incurs a voltage difference between gate electrodes and second electrodes of the third transistor M3 and the fourth transistor M4, so that the third transistor M3 and the fourth transistor M4 that are originally cut off are conducted, and then the right sound channel audio signal and the left sound channel audio signal are output to the first output end OP1 through the third transistor M3 and the second output end OP2 through the fourth transistor M4 respectively. This causes damage to another circuit structure coupled to the first output end OP1 and another circuit structure coupled to the second output end OP2.

To resolve the foregoing problem, as shown in FIG. 4, the structure of the third switch circuit 30 is further coupled to the right sound channel transmission end HSR and the left sound channel transmission end HSL.

In this case, the third switch circuit 30 further includes a third capacitor C3.

One end of the third capacitor C3 is coupled to the gate electrode of the third transistor M3, and another end of the third capacitor C3 is coupled to the right sound channel transmission end HSR. In this case, the right sound channel audio signal at the right sound channel transmission end HSR is transmitted to the gate electrode of the third transistor M3 through the third capacitor C3. In this case, when the right sound channel audio signal transmitted to the first signal transmission end ST1 is applied to the second electrode (S) of the third transistor M3, a voltage difference Vgs between the gate electrode and the second electrode of the third transistor M3 is equal to 0, and the third transistor M3 is still in a cut-off status. This avoids that the first signal transmission end ST1 and the first output end OP1 form a signal path used to transmit the external data or the charging voltage when the headset is inserted into the mobile phone.

Similarly, the third switch circuit 30 further includes a fourth capacitor C4. One end of the fourth capacitor C4 is coupled to the gate electrode of the fourth transistor M4, and another end of the fourth capacitor C4 is coupled to the left sound channel transmission end HSL. In this case, the left sound channel audio signal at the left sound channel transmission end HSL is transmitted to the gate electrode of the fourth transistor M4 through the fourth capacitor C4. In this case, when the left sound channel audio signal transmitted to the second signal transmission end ST2 is applied to the second electrode (S) of the fourth transistor M4, a voltage difference Vgs between the gate electrode and the second electrode of the fourth transistor M4 is equal to 0, and the fourth transistor M4 is still in the cut-off status. This avoids that the second signal transmission end ST2 and the second output end OP2 form a signal path used to transmit the external data or the charging voltage when the headset is inserted into the mobile phone.

An example in which the signal transmission between the first signal transmission end ST1 and the first output end OP1 is implemented through the third transistor M3, and the signal transmission between the second signal transmission end ST2 and the second output end OP2 is implemented through the fourth transistor M4 is used for description. In some other embodiments, if cabling space and product costs permit, the integrated switch including the NMOS transistor and the PMOS transistor may be used to replace the third transistor M3 and the fourth transistor M4.

The structure shown in FIG. 4 is used as an example, and parameters of some elements in FIG. 4 are shown in Table 1. In this case, after a THD indice of the multiplexing circuit 100 is tested with an audio signal shown in FIG. 6, a test result is shown in FIG. 7.

TABLE 1

| Resistor | Parameter | Capacitor | Parameter |
| --- | --- | --- | --- |
| R1 | 2 kΩ | C1 | 4.7 μF |
| R2 | 2 kΩ | C2 | 4.7 μF |
| R3 | 2 kΩ or 1 kΩ | C3 | 4.7 μF |
| R4 | 1 kΩ | C4 | 4.7 μF |
| R5 | 2 kΩ or 1 kΩ | | |
| R6 | 1 kΩ | | |

It can be noted that, when the external device (for example, the charger) is used to provide the second voltage V2 (which is at the high level) for the gate electrode of the third transistor M3 and the gate electrode of the fourth transistor M4, a resistance value of the third resistor R3 and a resistance value of the fifth resistor R5 may be 2 kΩ in consideration of a high voltage provided by the charger. When the second voltage V2 (which is at the high level) is provided to the gate electrode of the third transistor M3 and the gate electrode of the fourth transistor M4 in the system power supply manner, the resistance value of the third resistor R3 and the resistance value of the fifth resistor R5 may be 1 kΩ.

Figure 6:
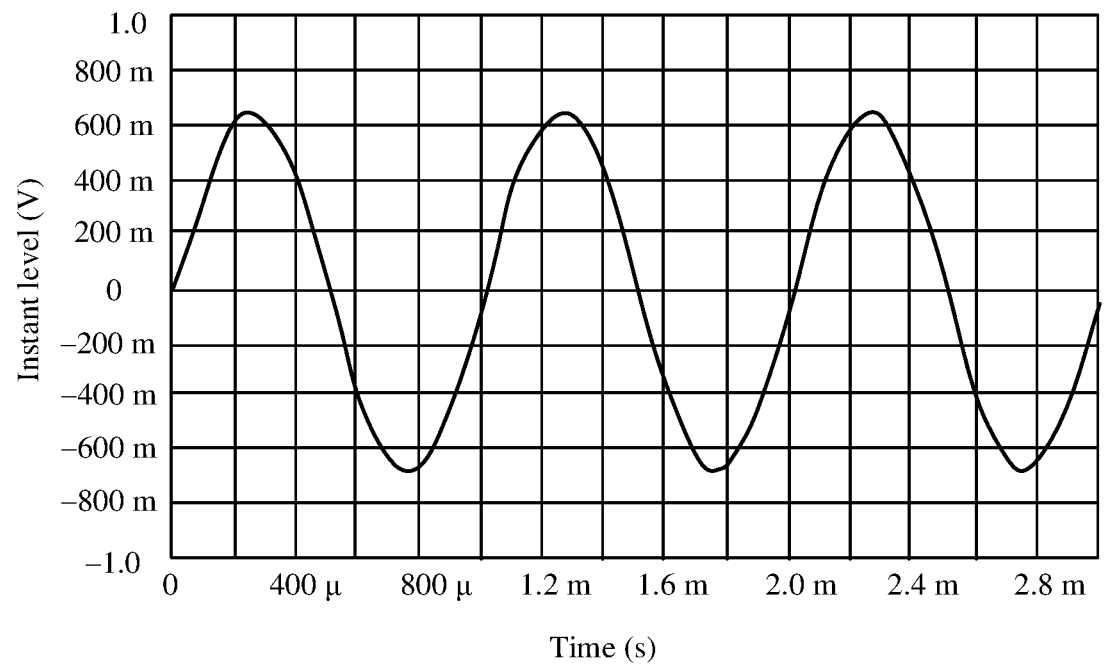
FIG. 6 is a waveform diagram of a right sound channel audio signal and a left sound channel audio signal according to some embodiments.
Figure 7:
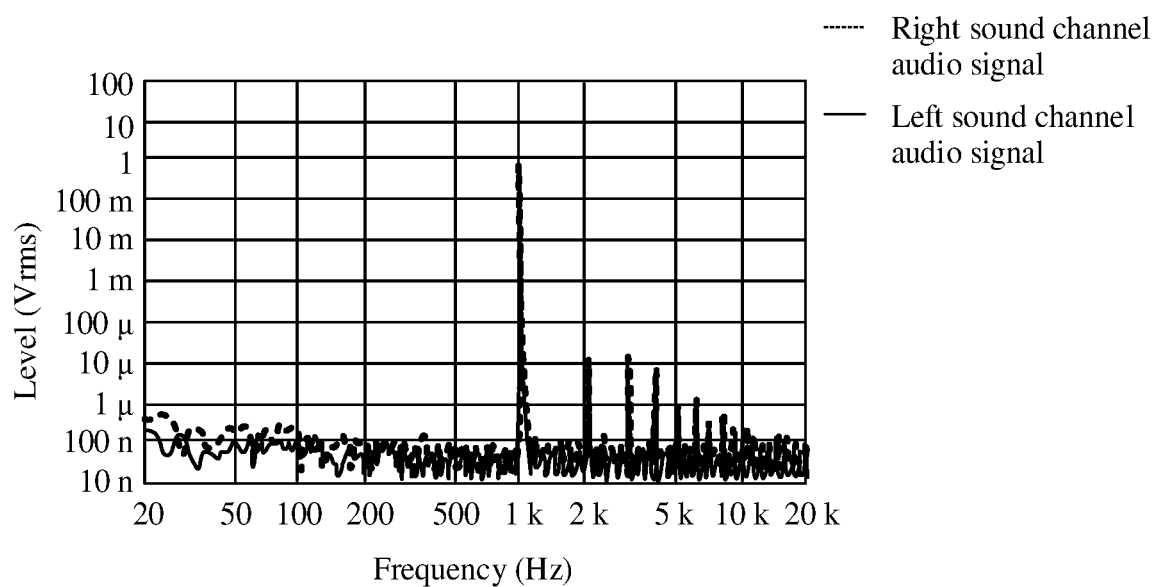
FIG. 7 is a schematic diagram of a relationship between a frequency and a level amplitude of a right sound channel audio signal and a frequency and a relationship between a level amplitude of a left sound channel audio signal according to some embodiments.

In a THD indice test process, as shown in FIG. 6, a waveform of the right sound channel audio signal provided by the right sound channel transmission end HSR overlaps with a waveform of the left sound channel audio signal provided by the left sound channel transmission end HSL. As shown in FIG. 7, when a frequency of the right sound channel audio signal (indicated by a dashed line) and a frequency of the left sound channel audio signal (indicated by a solid line) are 1 kHz, the waveform of the right sound channel audio signal and the waveform of the left sound channel audio signal have a maximum amplitude, and a sound source heard by a human ear has a maximum sound. In this case, a measured THD indice is about 92 dB, indicating high audio quality.

In addition, after an eye pattern test is performed on the external interface coupled to the multiplexing circuit 100, for example, the Type-C interface, an obtained eye pattern is comparatively centralized. Therefore, a signal transmission effect of the external interface coupled to the multiplexing circuit 100 is excellent. Therefore, the multiplexing circuit 100 provided not only has a simple structure and relatively low costs, but also has the comparatively high THD indice, to ensure the high audio quality in an audio transmission process. When the multiplexing circuit 100 is manufactured, the first transistor M1, the second transistor M2, the third transistor M3, and the fourth transistor M4 that have relatively small parasitic capacitance may be selected to further improve the signal transmission effect of the external interface coupled to the multiplexing circuit 100.

Some embodiments provide a mobile terminal. As shown in FIG. 8, the mobile terminal includes a central processing unit 112 (CPU), an audio codec 113, an external interface 110 (a Type-C interface) configured to be coupled to an external device, and any multiplexing circuit 100 described above.

Figure 9:
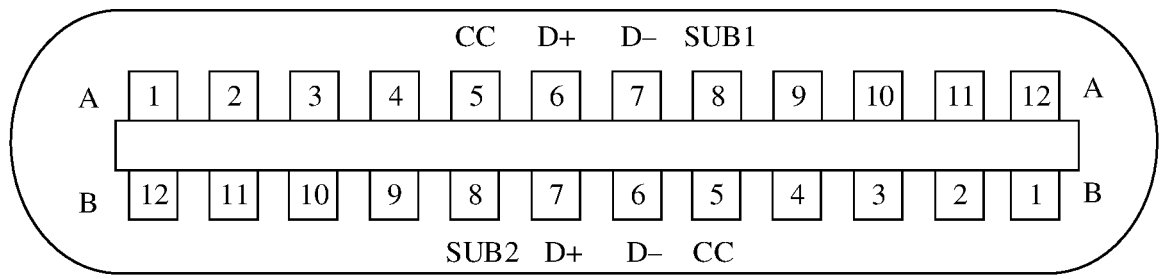
FIG. 9 is a schematic structural diagram of an external interface according to some embodiments.

As shown in FIG. 9, the external interface includes a D+ pin and a D− pin that are specified according to a Type-C interface protocol.

A first signal transmission end ST1 of the multiplexing circuit 100 is coupled to the D+ pin, a second signal transmission end ST2 is coupled to the D− pin, and a right sound channel transmission end HSR and a left sound channel transmission end HSL are coupled to the audio codec 113.

The audio decoder 103 is coupled to the central processing unit 112 through a serial low-power inter-chip media bus, (SLIMbus) and an internal-integrated circuit ($I^2C$) bus.

When the external device is a headset, the headset is coupled to the D+ pin and the D− pin of the Type-C interface. In this case, the audio codec 113 is configured to: decode an audio signal output by the central processing unit 112, provide a right sound channel audio signal to the right sound channel transmission end HSR, and provide a left sound channel audio signal to the left sound channel transmission end HSL.

In this case, in the multiplexing circuit 100, a first transistor M1 and a second transistor M2 are conducted; and a third transistor M3 and a fourth transistor M4 are cut off. The right sound channel transmission end HSR and the left sound channel transmission end HSL separately transmit the right sound channel audio signal and the left sound channel audio signal to the D+ pin and the D− pin through the first transistor M1 and the second transistor M2, so that a user can receive the audio signal through the headset.

In addition, a first output end OP1 and a second output end OP2 of the multiplexing circuit 100 are coupled to the central processing unit 112. When the external device is a non-headset device such as a charger, a mobile phone, a computer, a tablet computer, a vehicle-mounted device, or a mobile storage device, the external device is coupled to the D+ pin and the D− pin of the Type-C interface.

In this case, in the multiplexing circuit 100, the third transistor M3 and the fourth transistor M4 are conducted; and the first transistor M1 and the second transistor M2 are cut off. A signal of the D+ pin is transmitted to the first output end OP1 through the third transistor M3, and then provided to the central processing unit 112 by the first output end OP1. A signal of the D− pin is transmitted to the second output end OP2 through the fourth transistor M4, and then provided to the central processing unit 112 by the second output end OP2. In this way, transmission of a charging voltage or external data is implemented. Alternatively, the first output end OP1 of the multiplexing circuit 100 may transmit data in the central processing unit 112 of the mobile terminal to the D+ pin through the third transistor M3, and to the D− pin through the fourth transistor M4. In this case, after receiving the data in the central processing unit 112, a data cable coupled to the Type-C interface transmits the data to the external device coupled to the data cable.

In addition, when the headset is coupled to the Type-C interface, a microphone (MIC) of the headset is coupled to an SBU1 pin of the Type-C interface, and a ground end of the headset is coupled to an SBU2 pin of the Type-C interface. A signal at a MIC end of the headset can be transmitted to the audio codec 113, and then is transmitted to the central processing unit after being encoded by the audio codec 113.

In addition, the SBU1 pin and the SBU2 pin of the Type-C interface are located on a side A and a side B, respectively, of the Type-C interface. In this case, when the headset is inserted into the Type-C interface in a forward insertion (electrically coupled to the side A) manner, the MIC end of the headset is coupled to the SBU1 pin, the ground end is coupled to the SBU2 pin, and the signal at the MIC end can be normally input to the audio codec 113.

However, when the headset is inserted into the Type-C interface in a reverse insertion (electrically coupled to the side B) manner, the MIC end of the headset is coupled to the SBU2 pin, the ground end is coupled to the SBU1 pin, and the signal at the MIC end cannot be normally input to the audio codec 113. Therefore, the mobile terminal further includes an analog handover switch 114. The analog handover switch 114 may be used to switch a manner in which the SBU1 pin and the SBU2 pin are coupled to the headset. Therefore, regardless of whether the headset uses the forward insertion manner or the reverse insertion manner, it can be ensured that the MIC end of the headset is coupled to the SBU1 pin, and the ground end is coupled to the SBU2 pin.

In addition, a CC pin disposed on the Type-C interface may identify a type of the external device coupled to the Type-C interface. When the external device is identified to be the headset, a signal path that is in the multiplexing circuit 100 and that is used to transmit audio is enabled. Alternatively, when the external device is identified to be the non-headset device such as the charger, the mobile phone, the computer, or the mobile storage device, a signal path that is in the multiplexing circuit 100 and that is used to transmit the charging voltage or the external data is enabled.

It can be noted that the mobile terminal may include a mobile phone, a tablet computer, a personal digital assistant (PDA), a vehicle-mounted computer, and the like. A specific form of the mobile terminal is not limited in the embodiments. For ease of description, an example in which the mobile terminal is the mobile phone is used for description in the embodiments. In addition, the mobile terminal has a technical effect that is the same as that of the multiplexing circuit 100 provided in the foregoing embodiments. Details are not described herein again.

Figure 10:
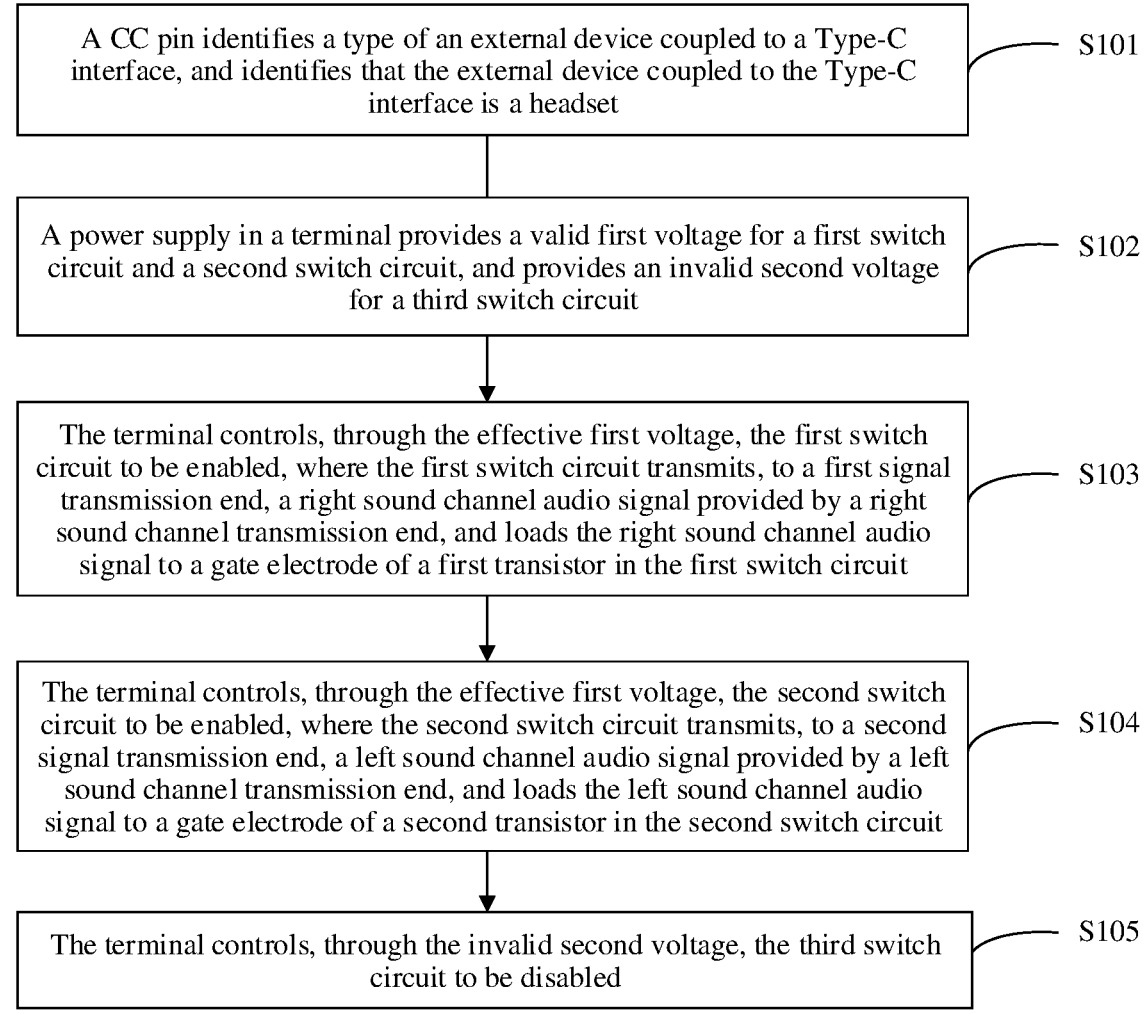
FIG. 10 is a flowchart of a working process of a terminal having a multiplexing circuit according to some embodiments.

Some embodiments provide a working process of a terminal having any multiplexing circuit 100 described above. The terminal has the foregoing external interface, for example, a Type-C interface, and the Type-C includes a CC pin. As shown in FIG. 10, when the multiplexing circuit 100 is configured to transmit an audio signal, the working process includes S101 to S105.

S101: A CC pin identifies a type of an external device coupled to a Type-C interface, and identifies that the external device coupled to the Type-C interface is a headset.

S102: A power supply in a terminal provides a valid first voltage V1 for a first switch circuit 10 and a second switch circuit 20, and provides an invalid second voltage V2 for a third switch circuit 30.

S103: The terminal controls, through the effective first voltage V1, the first switch circuit 10 to be enabled, where the first switch circuit 10 transmits, to a first signal transmission end ST1, a right sound channel audio signal provided by a right sound channel transmission end HSR, and loads the right sound channel audio signal to a gate electrode of a first transistor M1 in the first switch circuit 10.

As shown in FIG. 4, when the first voltage V1 is at a high level, the first transistor M1 is conducted, and the right sound channel audio signal provided by the right sound channel transmission end HSR is transmitted to the first signal transmission end ST1 through the first transistor M1. In addition, the right sound channel audio signal provided by the right sound channel transmission end HSR may also be loaded to the gate electrode of the first transistor M1 through a first capacitor C1, so that a voltage difference Vgs between the gate electrode and a second electrode of the first transistor M1 is equal to V1, and is a constant direct current voltage. Therefore, in a process of transmitting an audio signal, the first transistor M1 reduces a probability that impedance of the first transistor M1 changes.

S104: The terminal controls, through the effective first voltage V1, the second switch circuit 20 to be enabled, where the second switch circuit 20 transmits, to a second signal transmission end ST2, a left sound channel audio signal provided by a left sound channel transmission end HSL, and loads the left sound channel audio signal to a gate electrode of a second transistor M2 in the second switch circuit 20.

Similarly, as shown in FIG. 4, when the first voltage V1 is at the high level, the second transistor M2 is conducted, and the left sound channel audio signal provided by the left sound channel transmission end HSL is transmitted to the second signal transmission end ST2 through the second transistor M2. In addition, the left sound channel audio signal provided by the left sound channel transmission end HSL may also be loaded to the gate electrode of the second transistor M2 through a second capacitor C2, so that a voltage difference Vgs between the gate electrode and a second electrode of the second transistor M2 is equal to V1, and is the constant direct current voltage. Therefore, in a process of transmitting an audio signal, the second transistor M2 reduces a probability that impedance of the second transistor M2 changes.

S105: The terminal controls, through the invalid second voltage V2, the third switch circuit 30 to be disabled.

As shown in FIG. 4, when the second voltage V2 is at a low level, a third transistor M3 and a fourth transistor M4 in the third switch circuit 30 are cut off.

Figure 11:
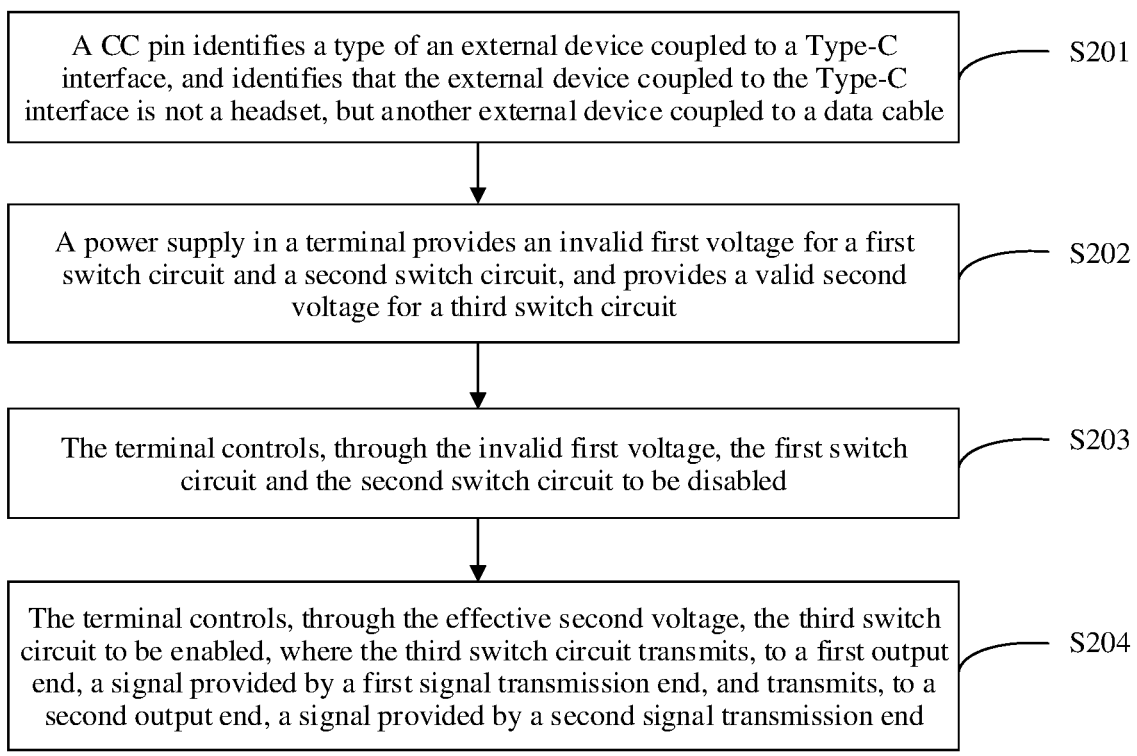
FIG. 11 is a flowchart of a working process of another terminal having a multiplexing circuit according to some embodiments.

Some other embodiments provide a working process of a terminal having any multiplexing circuit 100 described above. The terminal has the foregoing external interface, for example, a Type-C interface, and the Type-C includes a CC pin. As shown in FIG. 11, when the terminal is coupled to an external device through a data cable, the terminal receives a charging voltage or transmits external data through the multiplexing circuit 100, the working process includes S201 to S204.

S201: A CC pin identifies a type of an external device coupled to a Type-C interface, and identifies that the external device coupled to the Type-C interface is not a headset, but another external device coupled to a data cable, for example, a charger, a mobile storage device, a mobile phone, a computer, or the like.

S202: A power supply in a terminal provides an invalid first voltage V1 for a first switch circuit 10 and a second switch circuit 20, and provides a valid second voltage V2 for a third switch circuit 30.

S203: The terminal controls, through the invalid first voltage V1, the first switch circuit 10 and the second switch circuit 20 to be disabled.

As shown in FIG. 4, when the first voltage V1 is at a low level, a first transistor M1 in the first switch circuit 10 is cut off, and a second transistor M2 in the second switch circuit 20 is cut off.

S204: The terminal controls, through the effective second voltage V2, the third switch circuit 30 to be enabled, where the third switch circuit 30 transmits, to a first output end OP1, a signal provided by a first signal transmission end ST1, and transmits, to a second output end OP2, a signal provided by a second signal transmission end ST2.

As shown in FIG. 4, when the second voltage V2 is at a high level, a third transistor M3 is conducted, and the signal provided by the first signal transmission end ST1 is transmitted to the first output end OP1 through the third transistor M3. In addition, when a fourth transistor M4 is conducted, the signal provided by the second signal transmission end ST2 is transmitted to the second output end OP2 through the fourth transistor M4.

It can be noted that the terminal may be a computer, a smart television, a vehicle-mounted device, or the like. Alternatively, the terminal may be the foregoing mobile terminal, such as the mobile phone or the tablet computer.

The foregoing descriptions are merely specific implementations, but are not intended to limit the protection scope. Any variation or replacement within the technical scope disclosed herein shall fall within the protection scope.

What is claimed is:

1. A multiplexing circuit, comprising:
   a first switch circuit comprising:
      a first transistor having a first gate electrode, a first drain electrode, and a first source electrode, and
      a first constant voltage control circuit coupled to the first gate electrode and the first source electrode that is configured to
         receive a first voltage at the first gate electrode and
         load a right sound channel audio signal to the first gate electrode;
   a second switch circuit comprising:
      a second transistor having a second gate electrode, a second drain electrode, and a second source electrode, and
      a second constant voltage control circuit that is coupled to the second gate electrode and the second source electrode and configured to
         receive the first voltage at the second gate electrode and
         load a left sound channel audio signal to the second gate electrode;
   a third switch circuit configured to receive a second voltage;
   a first signal transmission end coupled to the first drain electrode, the first switch circuit, and the third switch circuit that is configured to receive the right sound channel audio signal from the first switch circuit under control of the first voltage;
   a second signal transmission end coupled to the second drain electrode, the second switch circuit, and the third switch circuit that is configured to receive a left sound channel audio signal from the second switch under control of the first voltage;
   a right sound channel transmission end coupled to the first source electrode and the first switch circuit that is configured to provide the right sound channel audio signal;
   a left sound channel transmission end coupled to the second source electrode and the second switch circuit that is configured to provide the left sound channel audio signal;
   a first output end coupled to the third switch circuit, wherein the third switch circuit is configured to provide a bidirectional connection between the first signal transmission end and the first output end under control of the second voltage; and
   a second output end coupled to the third switch circuit, wherein the third switch circuit is configured to provide a bidirectional connection between the second signal transmission end and the second output end under control of the second voltage.

2. The multiplexing circuit according to claim 1, wherein the first constant voltage control circuit further comprises a first capacitor that is coupled to both the first gate electrode and the first source electrode.

3. The multiplexing circuit according to claim 2, wherein a capacitance value of the first capacitor ranges from 4 μF to 10 μF.

4. The multiplexing circuit according to claim 2, wherein the first constant voltage control circuit further comprises a first inductor that is coupled to both the first gate electrode and the first source electrode.

5. The multiplexing circuit according to claim 1, wherein the first switch circuit further comprises a first resistor that is coupled to the first gate electrode and configured to receive the first voltage.

6. The multiplexing circuit according to claim 1, wherein the second constant voltage control circuit further comprises a second capacitor that is coupled to both the second gate electrode and the second source electrode.

7. The multiplexing circuit according to claim 6, wherein a capacitance value of the second capacitor ranges from 4 μF to 10 μF.

8. The multiplexing circuit according to claim 6, wherein the second constant voltage control circuit further comprises a second inductor that is coupled to both the second gate electrode and the second source electrode.

9. The multiplexing circuit according to claim 1, wherein the second switch circuit further comprises a second resistor that is coupled to the second gate electrode and configured to receive the first voltage.

10. The multiplexing circuit according to claim 1, wherein the third switch circuit further comprises:
   a third transistor comprising a third gate electrode, a third drain electrode, and a third source electrode, wherein the third gate electrode is configured to receive the second voltage, the third drain electrode is coupled to the first output end, and the third source electrode is coupled to the first signal transmission end, and
   a fourth transistor comprising a fourth gate electrode, a fourth drain electrode, and a fourth source electrode, wherein the fourth gate electrode is configured to receive the second voltage, the fourth drain electrode is coupled to the second output end, and the fourth source electrode is coupled to the second signal transmission end.

11. The multiplexing circuit according to claim 10, wherein the third switch circuit is further coupled to the right sound channel transmission end and the left sound channel transmission end, and the third switch circuit further comprises:
a third capacitor coupled to the third gate electrode and the right sound channel transmission end; and
a fourth capacitor, coupled to the fourth gate electrode and the left sound channel transmission end.

12. The multiplexing circuit according to claim 10, wherein the third switch circuit further comprises:
a third resistor coupled to the third gate electrode and configured to receive the second voltage;
a fourth resistor coupled to the third gate electrode and configured to be grounded,
a fifth resistor coupled to the fourth gate electrode and configured to receive the second voltage, and
a sixth resistor coupled to the fourth gate electrode and configured to be grounded.

13. A mobile terminal, comprising
a central processing unit;
an audio codec coupled to the central processing unit that is configured to decode an audio signal output by the central processing unit;
an external interface comprising a D+ pin and a D− pin that are specified according to a Type-C interface protocol that is configured to be coupled to an external device; and
a multiplexing circuit comprising:
a first switch circuit comprising
a first transistor having a first gate electrode, a first drain electrode, and a first source electrode, and
a first constant voltage control circuit coupled to the first gate electrode and the first source electrode that is configured to
receive a first voltage at the first gate electrode and load a right sound channel audio signal to the first gate electrode;
a second switch circuit comprising
a second transistor having a second gate electrode, a second drain electrode, and a second source electrode, and
a second constant voltage control circuit that is coupled to the second gate electrode and the second source electrode and configured to
receive the first voltage at the second gate electrode and
load a left sound channel audio signal to the second gate electrode;
a third switch circuit configured to receive a second voltage,
a first signal transmission end coupled to the D+ pin, the first drain electrode, the first switch circuit, and the third switch circuit that is configured to receive the right sound channel audio signal from the first switch circuit under control of the first voltage;
a second signal transmission end coupled to the D− pin, the second drain electrode, the second switch circuit, and the third switch circuit that is configured to receive a left sound channel audio signal from the second switch under control of the first voltage;
a right sound channel transmission end coupled to the audio codec, the first source electrode, and the first switch circuit that is configured to provide the right sound channel audio signal after receiving the right sound channel audio signal from the audio codec;
a left sound channel transmission end coupled to the audio codec, the second source electrode, and the second switch circuit that is configured to provide the left sound channel audio signal after receiving the left sound channel audio signal from the audio codec;
a first output end coupled to the third switch circuit, wherein the third switch circuit is configured to provide a bidirectional connection between the first signal transmission end and the first output end under control of the second voltage and between the D+ pin and the central processing unit; and
a second output end coupled to the third switch circuit, wherein the third switch circuit is configured to provide a bidirectional connection between the second signal transmission end and the second output end under control of the second voltage and between the D− pin and the central processing unit.

14. The mobile terminal according to claim 13, wherein the first constant voltage control circuit further comprises:
a first capacitor coupled to both the first gate electrode and the first source electrode.

15. The mobile terminal according to claim 14, wherein a capacitance value of the first capacitor ranges from 4 µF to 10 µF.

16. The mobile terminal according to claim 14, wherein the first constant voltage control circuit further comprises:
a first inductor coupled to both the first gate electrode and the first source electrode.

17. The mobile terminal according to claim 13, wherein the first switch circuit further comprises:
a first resistor configured to receive the first voltage that is coupled to the first gate electrode.

18. The mobile terminal according to claim 13, wherein the second constant voltage control circuit further comprises:
a second capacitor that is coupled to both the second gate electrode and the second source electrode.

19. The mobile terminal according to claim 18, wherein a capacitance value of the second capacitor ranges from 4 µF to 10 µF.

20. The mobile terminal according to claim 18, wherein the second constant voltage control circuit further comprises:
a second inductor that is coupled to both the second gate electrode and the second source electrode.

* * * * *